(12) United States Patent
Gutsche et al.

(10) Patent No.: US 6,559,005 B2
(45) Date of Patent: May 6, 2003

(54) METHOD FOR FABRICATING CAPACITOR ELECTRODES

(75) Inventors: Martin Gutsche, Dorfen (DE); Alexander Gschwandtner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/924,072

(22) Filed: Aug. 7, 2001

(65) Prior Publication Data

US 2002/0022316 A1 Feb. 21, 2002

(30) Foreign Application Priority Data

Aug. 7, 2000 (DE) .......................... 100 38 378

(51) Int. Cl.[7] .......................................... H01L 21/8242
(52) U.S. Cl. ...................................... 438/255; 438/398
(58) Field of Search ................... 438/255, 398

(56) References Cited

U.S. PATENT DOCUMENTS

| | | | | |
|---|---|---|---|---|
| 5,204,280 A | * | 4/1993 | Dhong et al. ............ | 438/386 |
| 5,350,707 A | * | 9/1994 | Ko et al. ................ | 438/396 |
| 5,723,379 A | | 3/1998 | Watanabe et al. | |
| 5,858,837 A | | 1/1999 | Sakoh et al. | |
| 5,858,852 A | | 1/1999 | Aiso et al. | |
| 5,872,033 A | | 2/1999 | Figura | |
| 5,877,061 A | | 3/1999 | Halle et al. | |
| 5,972,771 A | | 10/1999 | Figura | |
| 6,137,131 A | * | 10/2000 | Wu ........................ | 257/309 |

FOREIGN PATENT DOCUMENTS

EP 0 980 100 A2 2/2000

OTHER PUBLICATIONS

Y.K. Jun et al.: "The Fabrication and Electrical Properties of Modulated Stacked Capacitor for Advanced DRAM Applications" 1992 IEEE Electron. Device Letters, vol. 13, No. 8, Aug. 1992, pp. 430–432.
"Method for Increasing Capacitance Area Using RIE Selectivity", IBM Technical Disclosure Bulletin vol. 35 No. 7, Dec. 1992 pp. 464–467.

* cited by examiner

Primary Examiner—Jey Tsai
(74) Attorney, Agent, or Firm—Laurence A. Greenberg; Werner H. Stemer; Ralph E. Locher

(57) ABSTRACT

The method according to the invention enables the roughness of an HSG surface to be substantially transferred to the surface of an electrode. The electrode consequently acquires a microstructured surface, the area of which can be increased by more than 25%, preferably by more than 50% and particularly preferably by more than 100%. An HSG layer is used to locally mask the electrode surface or the sacrificial layer. Subsequent structuring processes, such as for example wet-chemical and/or plasma-assisted etching processes, nitriding or oxidation processes, make it possible—working on the basis of micromasking effects—to significantly roughen the electrode surface and thereby to increase the electrode surface area.

20 Claims, 10 Drawing Sheets

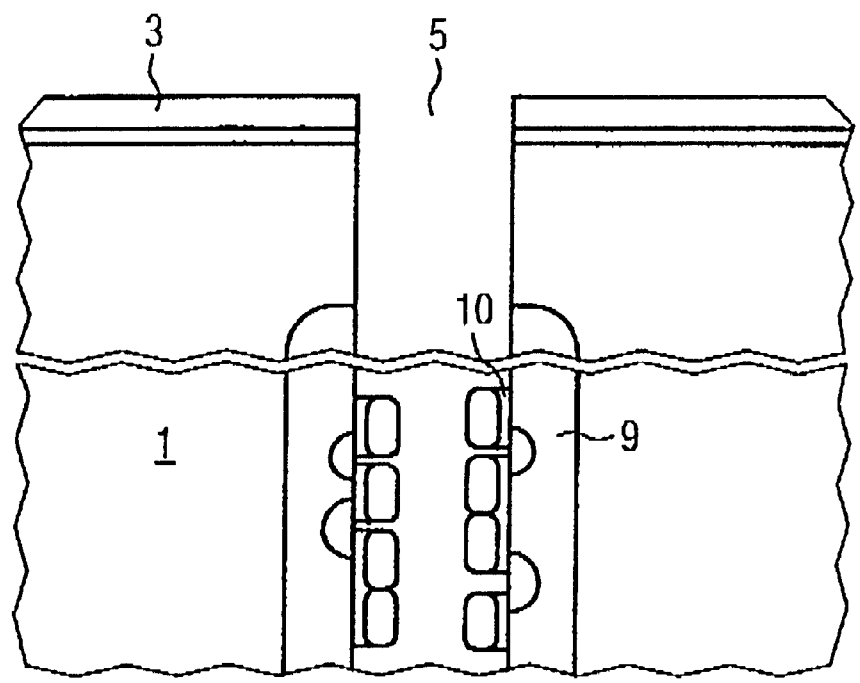
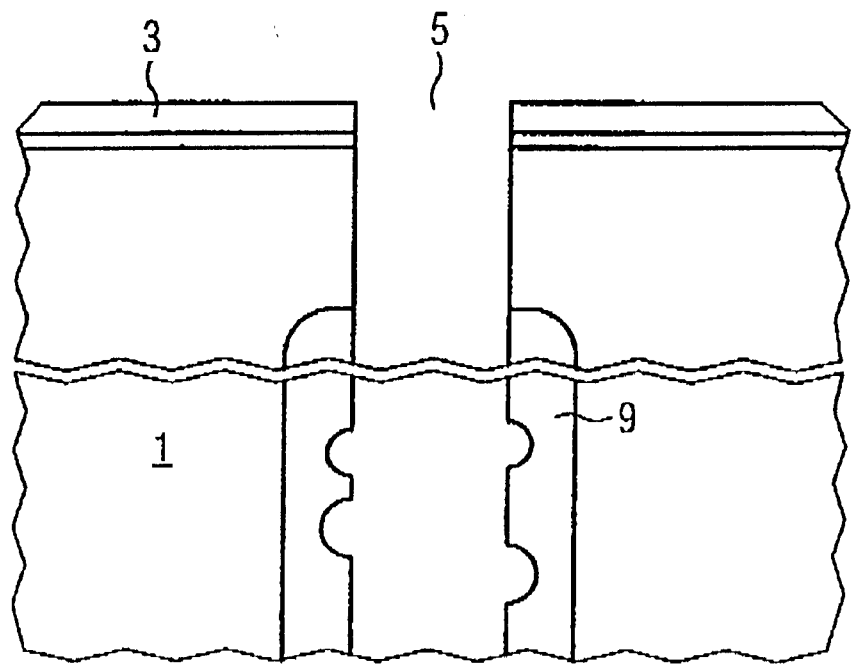

METHOD FOR FABRICATING CAPACITOR ELECTRODES

BACKGROUND OF THE INVENTION

Field of the Invention

The present invention relates to a method for fabricating capacitor electrodes. The present invention relates in particular to a method for fabricating capacitor electrodes in trenches, as are used, for example, in large-scale integrated memory components.

To be able to reproducibly read the charge which is stored in a storage capacitor of a memory cell, the capacitance of the storage capacitor should be at least 30 fF. At the same time, the lateral extent of the capacitor is being constantly reduced, in order to be able to increase the storage density. These contrary demands imposed on the capacitor of the memory cells lead to increasingly complex structuring of the capacitor ("trench capacitors", "stack capacitors", "crown-shaped capacitors"), in order to be able to provide a sufficient capacitor surface area despite the decreasing lateral extent of the capacitor.

In order, in stack capacitors or crown-shaped capacitors, to be able to ensure that the capacitance of the storage capacitor remains at least constant even as the lateral extent of the storage capacitor decreases, capacitor electrodes made from HSG (hemispherical grain) silicon are frequently used. The use of HSG silicon is a method which has been tried and tested and is well known in the semiconductor industry in order to increase the surface area of capacitor electrodes, in order, in this way, to raise the overall capacitance of the capacitor. Special deposition methods and/or special temperature treatments are used to produce small silicon grains, with the size of a few tens to hundreds of nm, on the capacitor surface. The silicon grains mean that the capacitor electrodes acquire a roughened and therefore enlarged surface area, which leads to increased capacitance of the storage capacitors.

Methods for producing HSG (hemispherical grain) silicon are described, for example, in U.S. Pat. Nos. 5,858,852, 5,858,837, and 5,723,379. Methods for increasing the capacitance of capacitors using HSG silicon are described, for example, in U.S. Pat. Nos. 5,877,061, 5,872,033 and 5,972,771. In the methods described in U.S. Pat. Nos. 5,872,033 and 5,972,771, the HSG grains undergo a further treatment by etching, so that the distance between the HSG grains is increased. In this way, the electrode surface area can be increased in a controlled manner. Unfortunately, the abovementioned methods also entail a range of drawbacks. The use of HSG grains as a significant constituent of the capacitor electrodes leads to an increased leakage current in the capacitor in question. Furthermore, the HSG grains on the electrode surface may lead to short-circuits between adjacent capacitors.

In addition to stack capacitors and crown-shaped capacitors, what are known as trench capacitors are also used, in order to be able to ensure that the capacitance of the storage capacitor remains at least constant while the lateral extent of the storage capacitor becomes ever smaller. While in the case of memory cells with stack capacitors or crown-shaped capacitors the storage capacitor is arranged above the select transistors, in memory cells with trench capacitors the storage capacitor is arranged below the select transistors in the semiconductor substrate.

The increasing integration density of the memory components in memory cells with trench capacitors leads to constantly falling trench diameters. In order, despite increasing trench diameters, to ensure a capacitor capacitance which remains approximately constant from generation to generation, it has hitherto been possible to increase the depth of the trench within certain limits. However, this direct route is encountering technological and economic limits. Firstly, etching processes which make it possible to produce ever higher aspect ratios are required in order to make the trench deeper. This already presents limits which are inherent to the process. Secondly, even if such etching processes exist, the longer etching time beyond a certain etching depth limits the economic viability of the procedure.

Using HSG silicon in trench capacitors in order to increase the electrode surface area with stack capacitors or crown-shaped capacitors is one option for increasing the electrode surface area. However, the growth of HSG silicon on the side walls of the trenches noticeably reduces the trench diameter. Consequently, considerable problems may arise during the subsequent production of the dielectric layer and the subsequent filling of the trenches with the counter-electrodes. By way of example, the HSG silicon may lead to constrictions within the trenches, preventing further filling of the trench ("cut-off effect").

SUMMARY OF THE INVENTION

Therefore, the present invention is based on the object of providing a method for fabricating capacitor electrodes which reduces or completely prevents the drawbacks of the conventional methods. In particular, the object of the present invention is to provide a method for the fabrication of capacitor electrodes in trenches which makes it possible to fabricate trench capacitors of sufficient capacitance without increasing the depth of the trenches.

This object is achieved by the method for fabricating capacitor electrodes described in the independent patent claim 1. Further advantageous embodiments, configurations and aspects of the present invention will emerge from the dependent patent claims, the description and the appended drawings.

The invention provides a method for fabricating capacitor electrodes comprising the following steps:
 a) an electrode is provided,
 b) at least one sacrificial layer is applied to the electrode;
 c) a discontinuous layer is applied to the sacrificial layer,
 d) the electrode is structured with the aid of the discontinuous layer and the sacrificial layer, so that an electrode with an enlarged surface is produced.

With the aid of the method according to the invention, it is possible for the roughness of the surface of the discontinuous layer to be substantially transferred to the surface of the electrode. The electrode consequently acquires a microstructured surface, the area of which can be increased by more than 25%, preferably by more than 50%, and particularly preferably by more than 100%. The discontinuous layer is used to locally mask the electrode surface or the sacrificial layer. Subsequent structuring processes, such as for example wet-chemical and/or plasma-assisted etching processes, nitriding or oxidation processes, make it possible—working on the basis of micromasking effects—to significantly roughen the electrode surface and thereby to increase the electrode surface area.

Unfortunately, it is not possible for every discontinuous layer to be applied to any desired electrode surface without difficulty. For example, it is difficult for HSG silicon with sufficient roughness, which is preferably used as the discontinuous layer, to be applied to monocrystalline silicon.

However, using a sacrificial layer provides a surface to which the discontinuous layer can be successfully applied. Accordingly, there is a wider selection of materials which can be used as the electrode material. Furthermore, during the actual microstructuring of the electrode surface, the sacrificial layer ensures sufficient selectivity with respect to the electrode surface.

Furthermore, the method according to the invention has the advantage that the discontinuous layer is either removed automatically during the structuring of the electrode or can be removed using an additional process step after the structuring of the electrodes. Therefore, the overall result is the geometric surface structure of the discontinuous layer without having to keep space reserved for the discontinuous layer itself. This is important in particular for the production of electrodes in trench capacitors, since in such capacitors the discontinuous layer would constrict the capacitor trench. Furthermore, the method according to the invention has the advantage that the electrode material is no longer restricted to the material of the discontinuous layer, for example HSG silicon. For example, it is now also possible to use single-crystal silicon for what is known as a "rough silicon capacitor", so that the leakage current properties of the capacitor are significantly improved.

According to a preferred embodiment, the discontinuous layer is deposited in such a way that adjacent grains or islands fuse together and thereby form larger cohesive regions, between which smaller uncovered openings remain. As an alternative, the discontinuous layer may be deposited in such a way that adjacent grains or islands are arranged substantially separately from one another. Which of these alternatives is used depends substantially on whether the structure of the discontinuous layer is to be transferred positively or negatively to the electrode. Furthermore, it is preferable if an HSG layer, in particular HSG silicon or HSG-SiGe (silicon/germanium), is used as the discontinuous layer.

According to a preferred embodiment, the sacrificial layer is structured to form a mask which is used for structuring the electrode. In this case, it is preferable in particular if the sacrificial layer is structured selectively with respect to the electrode and/or selectively with respect to the discontinuous layer. Wet-chemical or a dry-chemical method is preferably used to structure the sacrificial layer.

According to a further preferred embodiment, an oxide layer or nitride layer or an oxide/nitride double layer is used as the sacrificial layer.

Furthermore, it is preferable if the discontinuous layer is nitrided. It is also preferable if a nitride layer is used as the sacrificial layer and the discontinuous layer is at least partially oxidized before the structuring of the sacrificial layer.

Furthermore, it is preferable if the electrode is structured by isotropic etching or by oxidation with subsequent isotropic etching. In this case, it is particularly preferable if oxide regions, which subsequently serve as an etching mask for the isotropic etching of the electrode, are produced in the electrode with the aid of a nitride mask.

According to a further preferred embodiment, an oxide layer is used as the sacrificial layer and a nitriding treatment is carried out, so that nitride regions are produced in the electrode. In this case, it is particularly preferred if the electrode with the nitride regions is subsequently oxidized and is structured by isotropic oxide etching. Furthermore, it is preferable if the nitride regions in the electrode surface are used as a mask for isotropic etching.

According to a further preferred embodiment, monocrystalline or polycrystalline silicon is used as the material for the electrode.

BRIEF DESCRIPTION OF THE DRAWINGS

FIGS. 1–7 show a method for fabricating capacitor electrodes in accordance with a first embodiment of the present invention.

DESCRIPTION OF THE PREFERRED EMBODIMENT

Figure 1:
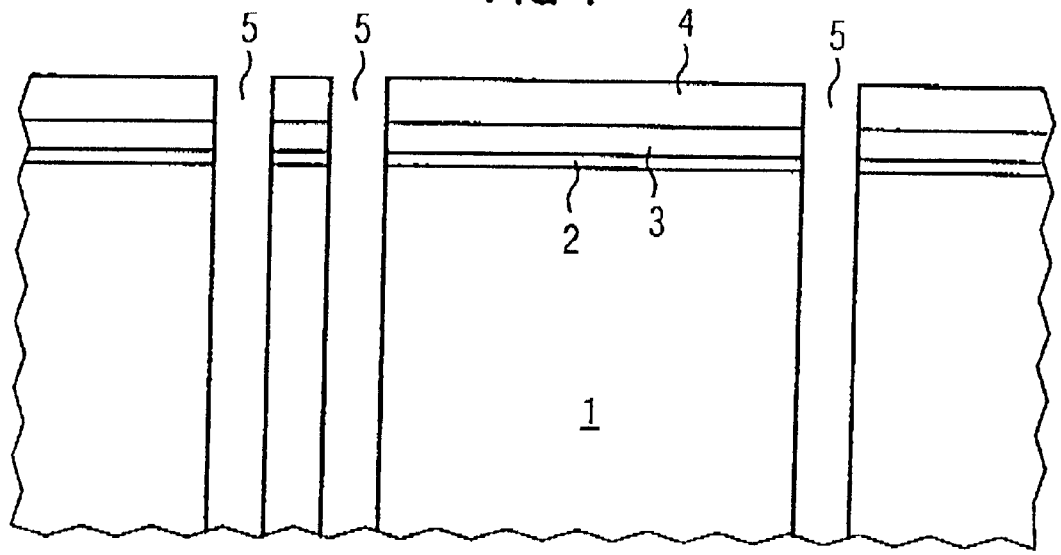

FIGS. 1 to 5 show a first embodiment of the present invention. A silicon oxide layer 2, a silicon nitride layer 3 and a further silicon oxide layer 4 are arranged on a silicon substrate 1. The silicon oxide layers 2 and 4 and the silicon nitride layer 3 are structured with the aid of a photographic technique, so that these layers can then be used as a mask for etching the trenches. In the present example, the silicon substrate 1 is weakly p-doped. The etching of the trenches 5 then takes place. The etching results in trenches 5 which are approximately 1–10 $\mu$m deep. The resulting situation is shown in FIG. 1.

Then, the silicon oxide layer 4 is removed. The deposition of a layer of arsenic glass 7 then follows. By means of a further photographic technique, the trenches 5 are filled with photoresist up to a predetermined height (not shown), and the arsenic-glass layer 7 above the photoresist is removed by etching the arsenic-glass layer 7. After the photoresist has been removed, the layer of arsenic glass 7 is covered with a further silicon oxide layer 8. This additional silicon oxide layer 8 prevents contamination of the environment by the arsenic which diffuses out.

Figure 2:
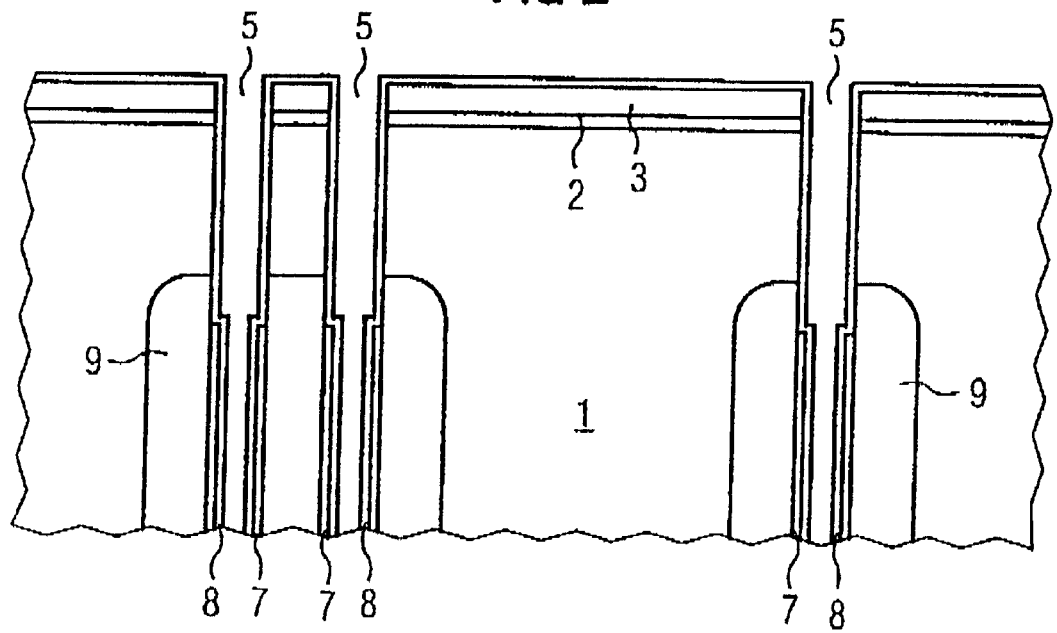

Then, a heat treatment is carried out, in order to introduce the dopant arsenic from the arsenic-glass layer 7 which has remained in the trenches 5 into the substrate 1. As a result, an n-conducting diffusion region, which in each case forms a first electrode 9, is formed in each of the side walls of the trenches 5. The first step of the method according to the invention, namely that of providing an electrode, is then concluded. The resulting situation is shown in FIG. 2.

Figure 3:
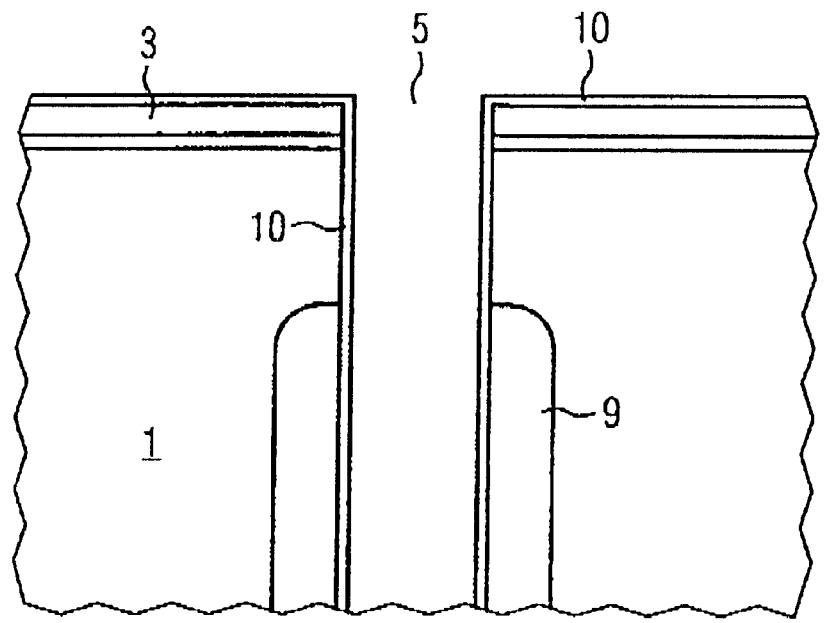

Then, the layers 7 and 8 and the native oxide which generally forms on the crystalline silicon surface are removed, for example by wet-chemical HF etching or HF vapor. Then, a sacrificial layer, for example a silicon nitride layer 10, is produced on the electrode surface. The silicon nitride layer is preferably applied by thermal nitriding (RTN or furnace) of the crystalline silicon surface and/or by deposition of a thin silicon-nitride film using a CVD process. The second step of the method according to the invention, namely the application of a sacrificial layer, is thus concluded. The resulting situation is shown in FIG. 3.

Next, a discontinuous layer is deposited. This means that a layer which does not completely cover the sacrificial layer, but rather has recurring uncovered openings leading to the sacrificial layer between the individual grains or islands or between the larger cohesive regions of grains or islands, is deposited.

In the present example, the discontinuous layer is an HSG layer, in particular HSG silicon, which is applied to the sacrificial layer. A range of methods are available for this purpose. For example, silicon can be deposited at the transition temperature Tc (approximately 550° C.–580° C.) between amorphous and polycrystalline silicon. In this case, the HSG silicon forms in situ. Alternatively, amorphous (unroughened) silicon can be deposited at a temperature which is significantly below the transition temperature Tc. The deposition of the amorphous silicon is followed by a heat treatment step at or above the transition temperature Tc. In this method, the initially smooth, amorphous silicon is only converted into the rough or granular HSG silicon in the following heat treatment step.

A further method for producing HSG silicon results from the deposition of amorphous silicon followed by seeding of the amorphous layer at the transition temperature Tc to produce silicon crystallites. Then, a further heat treatment of the seeded silicon layer is carried out, in order to produce fully grown HSG grains. During the further heat treatment, the grains grow by incorporating material from the as yet unconsumed amorphous silicon layer. Depending on the particular procedure, it is also possible to dispense with a further heat treatment.

HSG silicon is preferably to be formed selectively only at certain locations. Accordingly, structuring of the amorphous silicon layer can be carried out after deposition of the amorphous silicon. This may take place, for example, by means of wet-chemical or dry-chemical processes. There then follows a selective seeding of the amorphous silicon layer at the transition temperature Tc in order to produce silicon crystallites. The process parameters are in this case selected in such a way that the silicon is only deposited on a silicon substrate but not, for example, on silicon oxide and/or silicon nitride. If selective HSG deposition is used, the upper region of the trenches 5, which subsequently receives what is known as the collar, can be reliably protected from the effects of the microstructuring of the electrode surface. Direct nucleation of polycrystalline silicon can also be used as a further process for producing HSG silicon; this direct nucleation is possible in a broad temperature range above Tc. The usual result is insular growth on an amorphous substrate.

Figure 4:
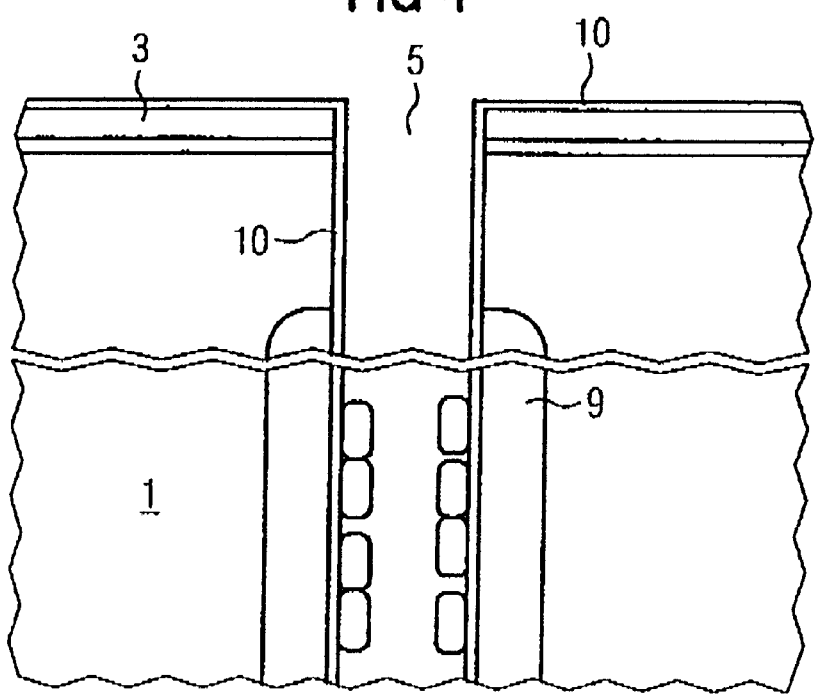

A common feature of all methods for the formation of HSG grains 11 is that Si crystallites are formed first, and these crystallites then increase in size and, under suitable process conditions, do not form a completely cohesive layer, but rather lead to the formation of silicon grains. Consequently, HSG silicon with a greatly increased surface area is formed. The HSG silicon is preferably deposited in such a way that adjacent grains 11 fuse together and thereby form larger cohesive regions, between which smaller uncovered openings remain. The resulting situation is illustrated in FIG. 4.

Figure 5:
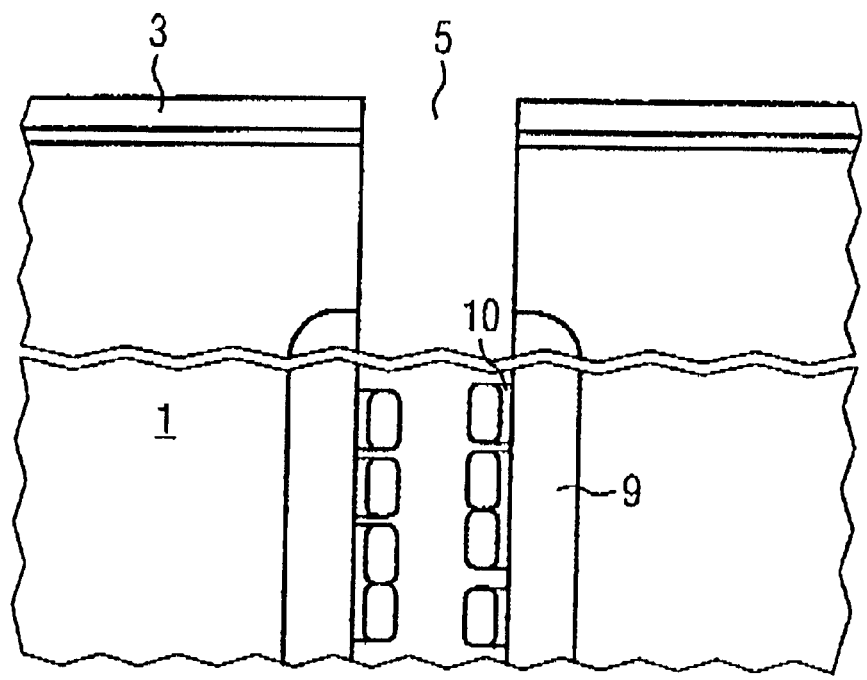

There then follows the structuring of the sacrificial layer 10 utilizing the micromasking effects of the HSG silicon. Therefore, a mask, which is subsequently used for the actual structuring of the electrode 9, is produced from the silicon nitride layer 10, for example by wet-chemical or dry-chemical etching. The resulting situation is illustrated in FIG. 5.

Figure 6A:
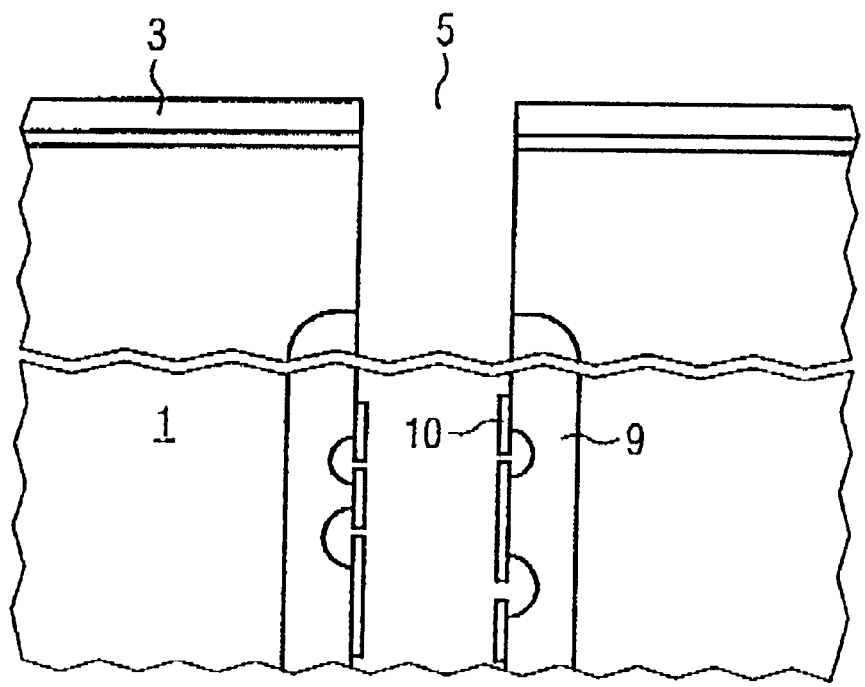

The transfer of the surface roughness to the crystalline silicon, i.e. the structuring of the electrode 9, then follows. The structuring preferably takes place using an isotropic back etch (wet-chemical or by means of dry etching, e.g. CDE) or by partial oxidation into the crystalline silicon with subsequent removal of the oxide. FIG. 6A shows the result of an isotropic etching step, while FIG. 6B illustrates the result of partial oxidation.

Then, the silicon nitride mask or the silicon nitride mask and the partially oxidized silicon is removed, so that only the microstructured electrode 9 remains (FIG. 7). On account of the microstructuring, the electrode now has a significantly increased surface area, which is accordingly reflected in an increased capacitance of the capacitor which is yet to be produced. The steps of producing the dielectric layer of the capacitor and of producing the second capacitor electrode then follow. Next, what is known as a collar and the contact to the select transistor, which is yet to be produced, are produced in the upper region of the trench. The steps required for this purpose are known and are therefore not explained in further detail.

Starting from FIG. 4, it is additionally possible to carry out thermal oxidation (RTO) of the surface, in order to partially oxidize any silicon residues between the HSG grains 11. These are then removed, for example with the aid of a wet-chemical HF treatment. A further thermal oxidation of the HSG silicon preferably follows, in order to produce an oxide mask which facilitates the subsequent structuring of the nitride mask. The parameters of this oxidation may be selected in such a way that only a small part of the surface of the HSG grains 11 is oxidized. However, the parameters of the oxidation may also be selected in such a way that the HSG grains 11 are completely oxidized.

In a further alternative, nitriding of the HSG grains 11 and/or deposition of a thin silicon nitride layer may be carried out instead of oxidation of the HSG grains 11. In the case of the nitriding, an SiN/Si/SiN layer stack is formed in the region of the HSG grains, and this layer stack is significantly more resistant when using suitable etching chemistry than the simple SiN layer between the grains. During the nitriding, substantially all that happens is that the silicon of the HSG grains at the surface is converted into silicon nitride, while the SiN layer between the HSG grains scarcely increases in thickness, on account of the saturation characteristics.

The structuring or formation of the nitride mask is in turn followed by the transfer of the surface roughness to the crystalline silicon, as has already been described in connection with FIGS. 6A and 6B.

FIGS. 8 to 11 show a further embodiment of the present invention. The first steps of this method correspond to the steps which have been explained in connection with the FIGS. 1 to 2, and therefore there is no need to repeat the description of these steps.

Figure 8:
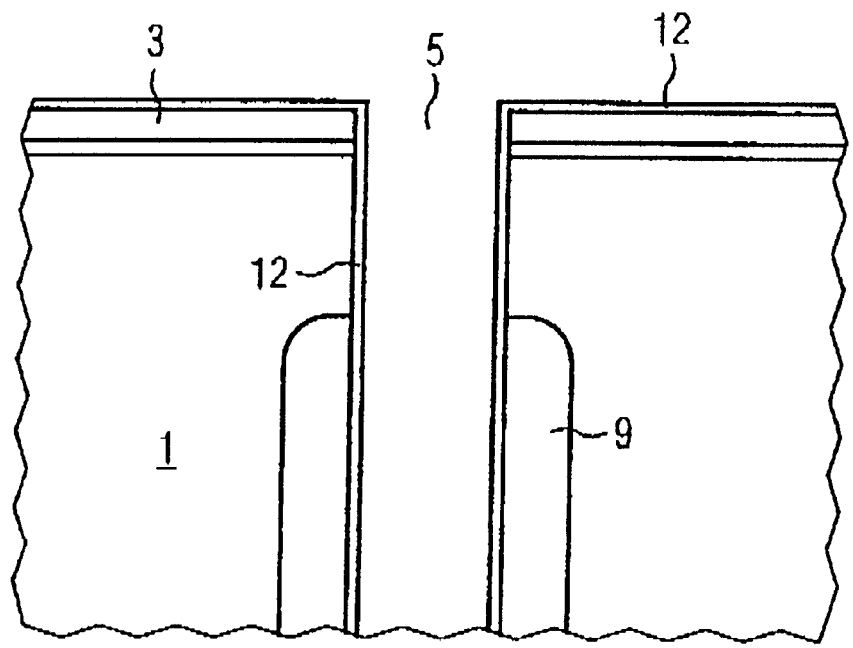
FIGS. 8–11 show a method for fabricating capacitor electrodes in accordance with a further embodiment of the present invention.

Starting from the situation shown in FIG. 2, the layers 7 and 9, and preferably the native oxide, which generally forms on the crystalline silicon surface, are removed, for example by wet-chemical HF etching or by means of HF vapor. Then, a sacrificial layer, in this embodiment a silicon oxide layer 12, is produced on the electrode surface. The silicon oxide layer 12 is preferably applied by thermal oxidation (RTO or furnace) of the crystalline silicon surface and/or by deposition of a thin silicon oxide film using a CVD process. The second step of the method according to the invention, namely the application of a sacrificial layer, is thereby concluded. The resulting situation is illustrated in FIG. 8.

Figure 9:
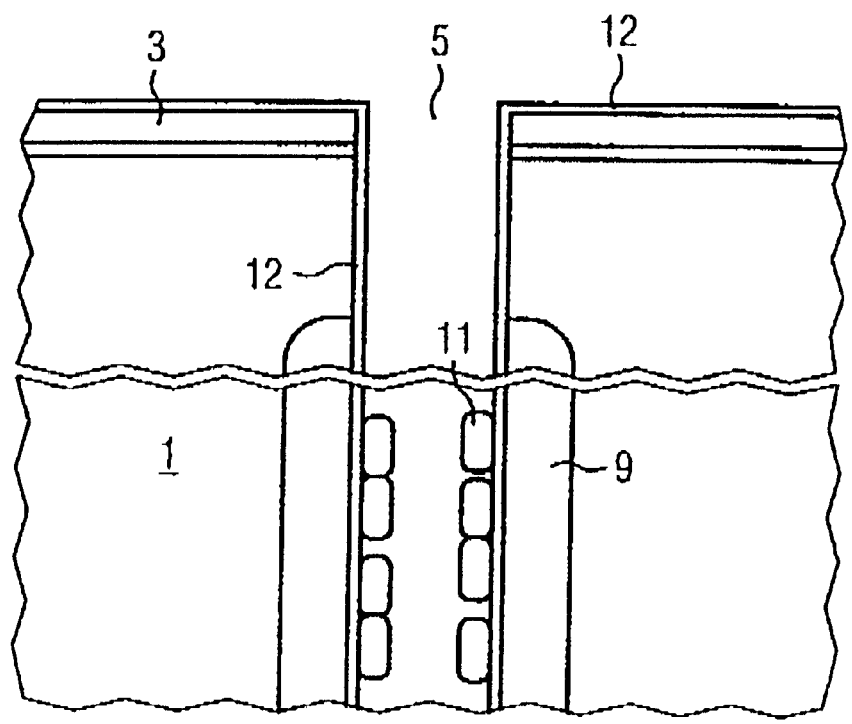

Next, an HSG layer, in particular HSG silicon, is applied to the sacrificial layer. Once again, the HSG silicon is preferably deposited in such a way that adjacent grains 11 fuse together, and thereby form larger cohesive regions between which smaller, uncovered openings remain. The resulting situation is illustrated in FIG. 9.

Figure 10:
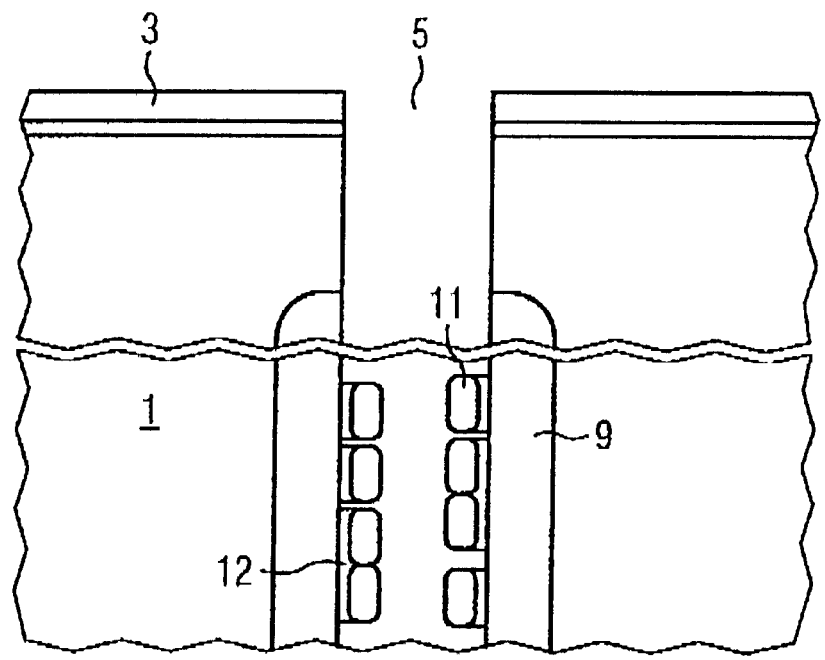
Figure 11:
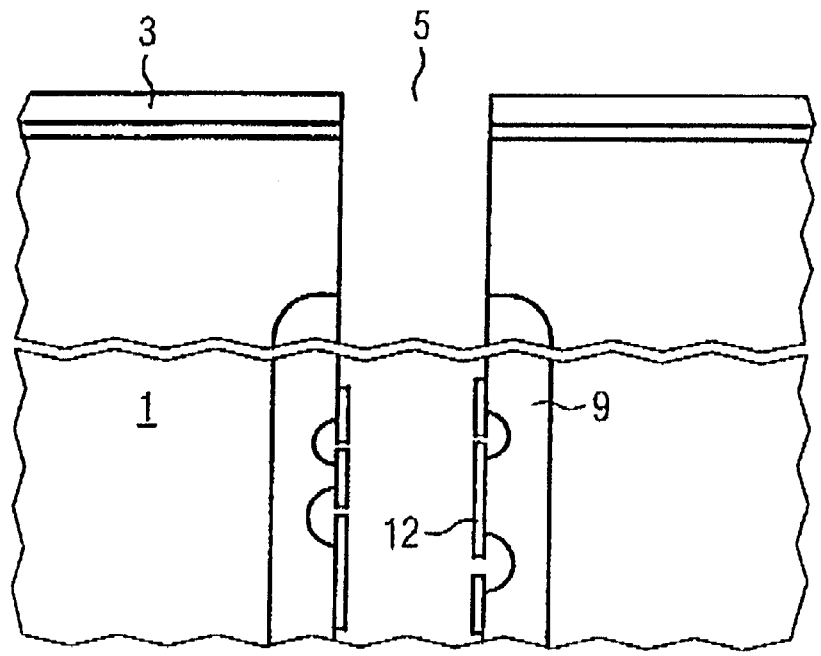

Thermal oxidation (RTO) of the surface is preferably then carried out, in order to partially oxidize any silicon residues which remain between the HSG grains. These are then removed together with the exposed regions of the sacrificial layer, for example using a wet-chemical HF treatment (FIG. 10).

Next comes the transfer of the surface roughness to the crystalline silicon, i.e. the structuring of the electrode 9. The structuring in this case preferably takes place by means of an isotropic back etch (FIG. 11) or by partial oxidation into the crystalline silicon with subsequent removal of the oxide. Then, oxide residues are once again removed by an HF etching solution.

In an alternative embodiment, partial oxidation into the crystalline silicon may also take place directly after the application of the HSG silicon. Prior structuring of the sacrificial layer is in this case dispensed with. Then, the oxide is removed from the surface, so that a microstructured electrode surface remains.

FIGS. 12 to 15 show a further embodiment of the present invention. The first steps of this method correspond to the steps which have been explained in connection with FIGS. 1 and 2 and FIGS. 8 and 9.

Figure 12:
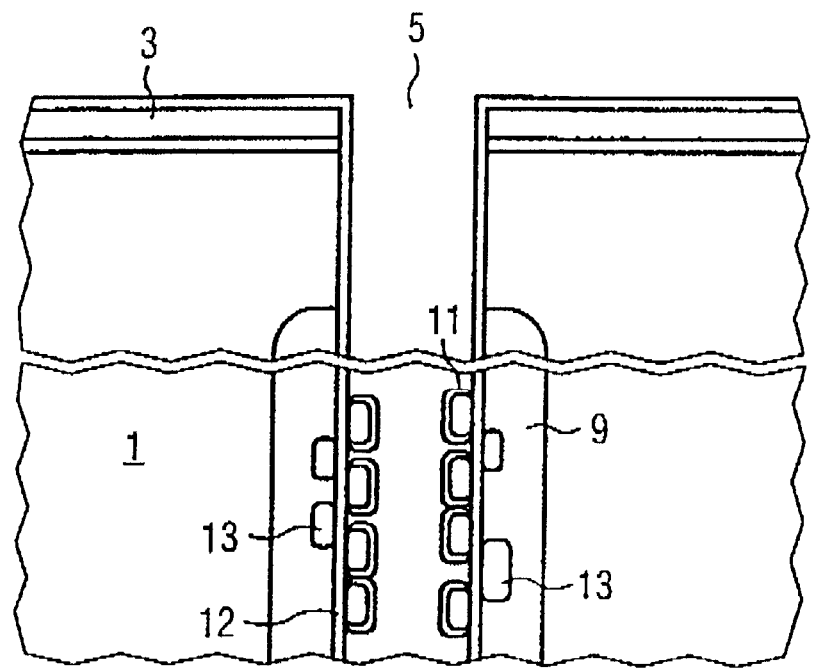
FIGS. 12–15 show a method for fabricating capacitor electrodes in accordance with a further embodiment of the present invention.

Starting from FIG. 9, the interface with the crystalline silicon beneath the sacrificial layer is partially nitrided using an RTN step. Therefore, the layer sequence comprising monocrystalline silicon 1, silicon nitride 13, silicon oxide 12 is formed between the HSG grains. The resulting situation is shown in FIG. 12. Then, the HSG grains and the silicon nitride covering them are selectively removed with respect to the silicon oxide of the sacrificial layer.

Figure 13:
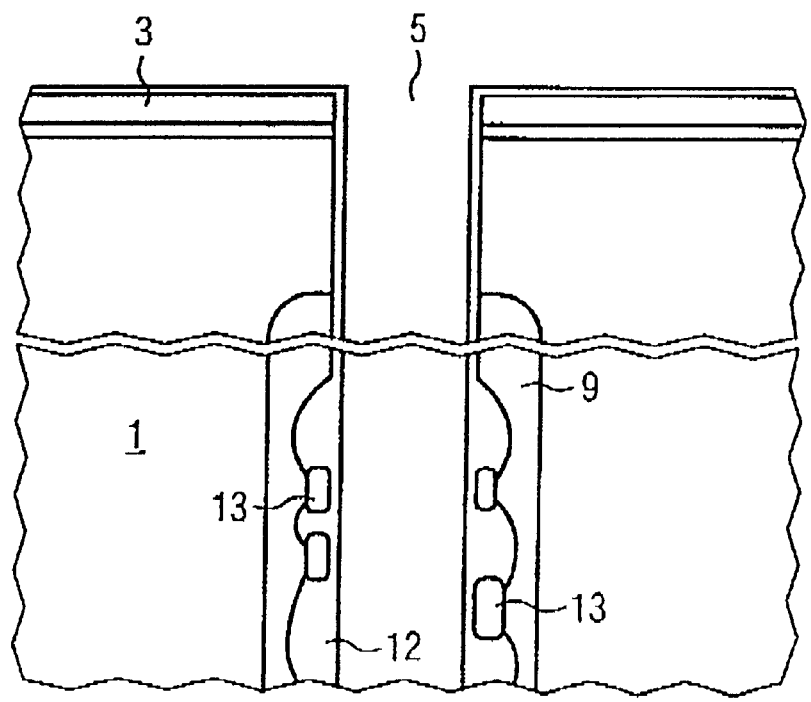
Figure 14:
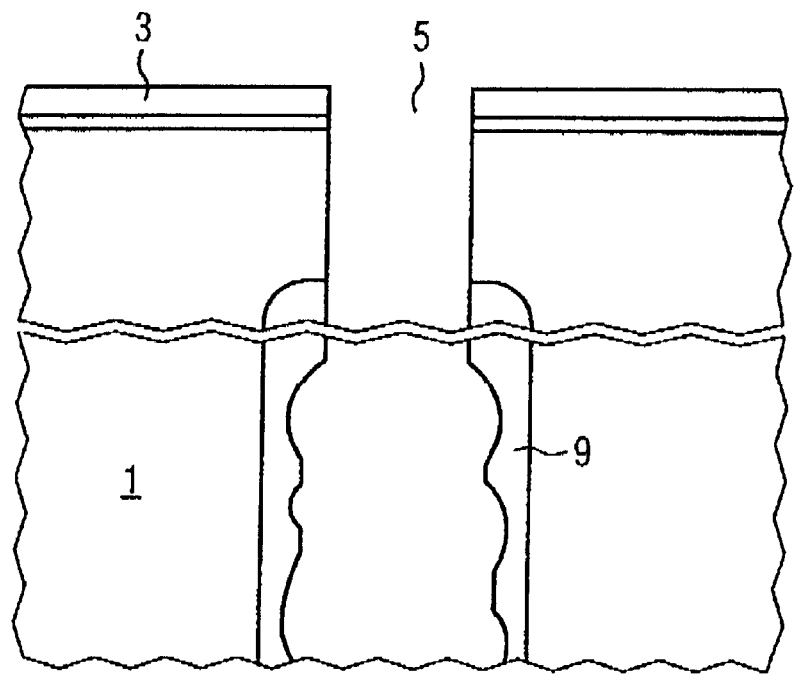

The surface roughness is then transferred to the crystalline silicon, i.e. the electrode 9 is structured. The structuring in this case preferably takes place by means of partial oxidation into the crystalline silicon with subsequent removal of the oxide. FIG. 13 shows the result of the oxidation, while FIG. 14 shows the situation after the removal of the oxide or of the nitride.

Figure 15:
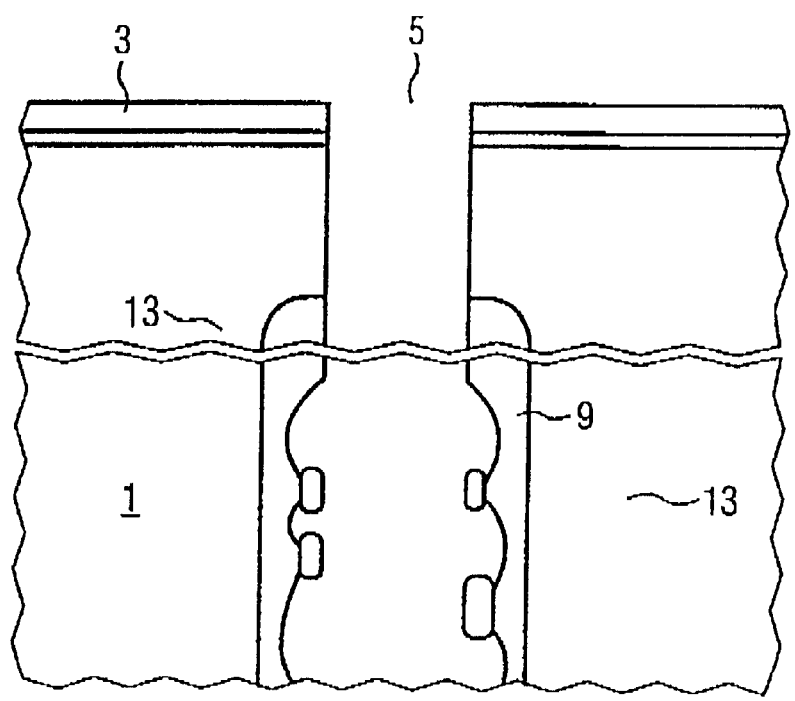

As an alternative to oxidation, the sacrificial layer can also be removed selectively with respect to the silicon and silicon nitride. Then, isotropic etching is carried out, the silicon nitride islands serving as an etching mask. The resulting situation is illustrated in FIG. 15. After the removal of the silicon nitride mask, the result, once again, is a microstructured electrode surface, the area of which has been increased significantly by the microstructuring.

FIGS. 16 to 19 show a further embodiment of the present invention. The first steps of this method correspond to the steps which have been explained in connection with FIGS. 1 and 2.

Then, a lower silicon nitride layer is formed on the crystalline silicon, for example by thermal nitriding and/or by deposition of a thin silicon nitride film 10, for example with the aid of a CVD process. Then, an upper silicon oxide layer 12 is produced, for example with the aid of a CVD process. This double layer comprising silicon nitride layer and silicon oxide layer acts as the sacrificial layer in this embodiment of the invention.

Figure 16:
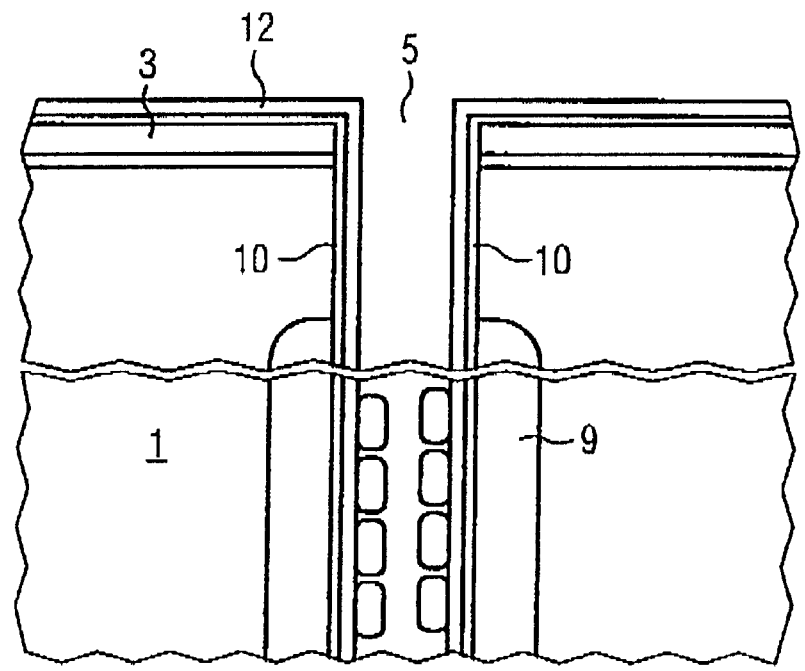
FIGS. 16–19 show a method for fabricating capacitor electrodes in accordance with a further embodiment of the present invention.

Then, an HSG layer, in particular HSG silicon, is applied to the sacrificial layer. The HSG silicon is preferably deposited in such a way that adjacent grains 11 are arranged separately from one another and do not fuse together to form larger clusters. The resulting situation is shown in FIG. 16.

Figure 17:
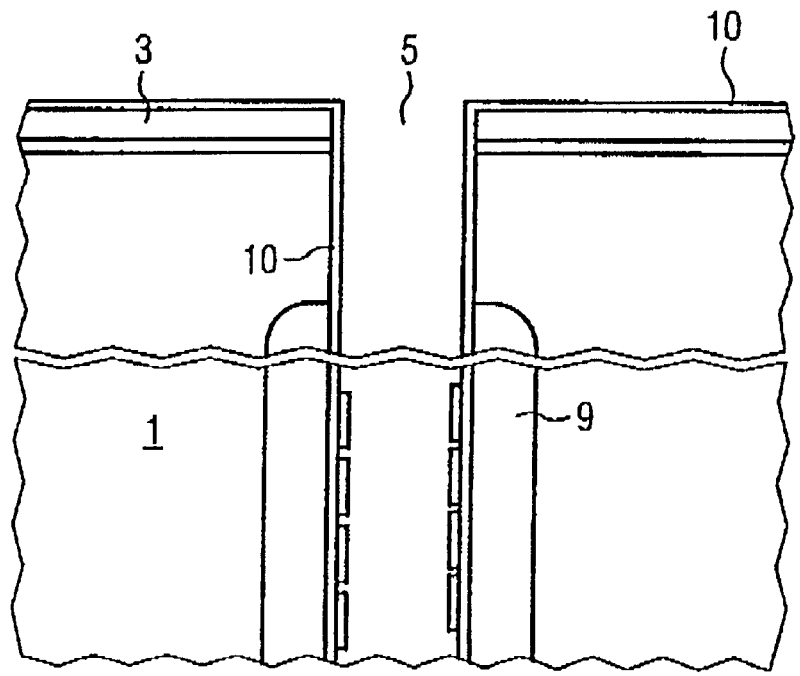

To remove any silicon residues between the HSG grains 11, short partial oxidation can take place, and the oxide which forms can be removed by etching. Then, silicon oxide etching, for example with the aid of HF, is carried out selectively with respect to the silicon nitride layer, the HSG grains being used as an etching mask. Furthermore, the HSG grains are removed selectively with respect to the substrate. The resulting situation is illustrated in FIG. 17.

Figure 18:
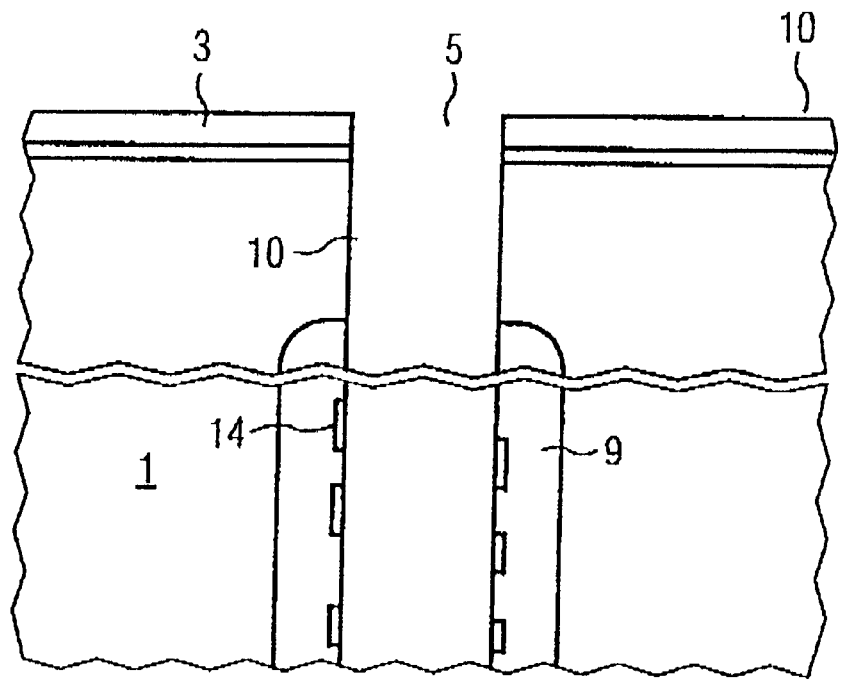

There then follows the structuring of the silicon nitride layer, with the oxide islands being used as an etching mask. After the structuring of the silicon nitride layer, the oxide islands are removed, so that only a silicon nitride mask remains on the electrode. Oxidation 14 of the exposed crystalline silicon of the electrode 9 and removal of the silicon nitride mask then take place. The resulting situation is illustrated in FIG. 18.

Figure 19:
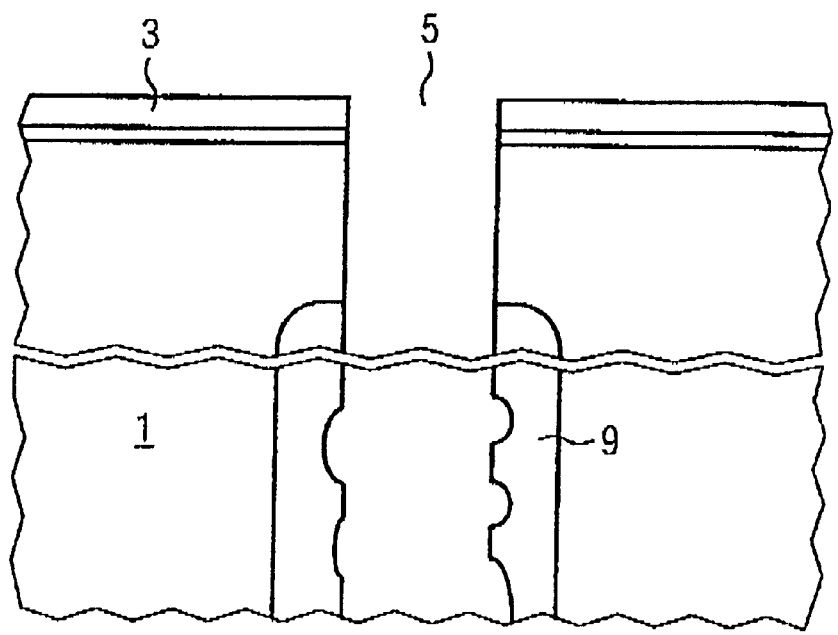

The electrode 9 is structured further by isotropic etching of the silicon. In this process, the silicon oxide serves as an etching mask. Then, the silicon oxide 14 is removed selectively with respect to the crystalline silicon, so that a microstructured electrode surface has once again been formed, with an area which has been considerably increased by the microstructuring. The resulting situation is illustrated in FIG. 19.

We claim:

1. A method for fabricating capacitor electrodes, which comprises:
providing an electrode having a surface area;
applying at least one sacrificial layer to the electrode, the sacrificial layer including silicon nitride;
applying a discontinuous layer to the sacrificial layer;
using the discontinuous layer to structure the sacrificial layer; and
using the structured sacrificial layer as a mask to structure the electrode by oxidation with subsequent isotropic etching and to thereby increase the surface area of the electrode.

2. The method according to claim 1, wherein the step of applying the discontinuous layer includes depositing the discontinuous layer such that adjacent grains fuse together to form larger cohesive regions and smaller uncovered openings remain between the larger cohesive regions.

3. The method according to claim 1, wherein the step of applying the discontinuous layer includes depositing the discontinuous layer such that adjacent grains are arranged substantially separately from one another.

4. The method according to claim 1, which comprises using an HSG layer as the discontinuous layer.

5. The method according to claim 1, which comprises using a layer selected from the group consisting of HSG silicon and HSG-SiGe as the discontinuous layer.

6. The method according to claim 1, which comprises structuring the sacrificial layer to form a mask that is used to structure the electrode.

7. The method as claimed in claim 6, which comprises selectively structuring the sacrificial layer with respect to the electrode.

8. The method as claimed in claim 6, which comprises selectively structuring the sacrificial layer with respect to the discontinuous layer.

9. The method according to claim 1, which comprises using a layer selected from the group consisting of an oxide layer and a nitride layer as the sacrificial layer.

10. The method according to claim 1, which comprises using a double layer including silicon oxide and silicon nitride as the sacrificial layer.

11. The method according to claim 1, which comprises nitriding the discontinuous layer.

12. The method according to claim 1, which comprises:
using a nitride layer as the sacrificial layer; and at least partially oxidizing the discontinuous layer before structuring the sacrificial layer.

13. The method according to claim 1, wherein the electrode is structured by performing a process selected from the group consisting of isotropic etching and oxidation with subsequent isotropic etching.

14. The method according to claim 1, which comprises:
using a nitride mask to produce oxide regions in the electrode; and
subsequently using the oxide regions as an etching mask when isotropically etching the electrode.

15. The method according to claim 1, which comprises:
using an oxide layer as the sacrificial layer; and
performing a nitriding treatment so that nitride regions are produced in the electrode.

16. The method as claimed in claim 15, which comprises:
oxidizing the electrode with the nitride regions; and
performing isotropic oxide etching to structure the electrode with the nitride regions.

17. The method as claimed in claim 15, which comprises using the nitride regions, which are located in a surface of the electrode, as a mask for isotropic etching.

18. The method according to claim 1, which comprises using a material selected from the group consisting of monocrystalline silicon and polycrystalline silicon for the electrode.

19. The method according to claim 1, wherein the step of subsequent isotropic etching comprises etching the oxidized parts of the electrode.

20. The method according to claim 1, wherein the step of subsequent isotropic etching comprises etching the electrode using the oxidized parts of the electrode as a mask.

* * * * *